United States Patent
Popescu

(10) Patent No.: US 8,725,100 B2
(45) Date of Patent: May 13, 2014

(54) APPARATUS AND METHOD OF REDUCING NOISE FOR FREQUENCY MODULATED SIGNALS

(75) Inventor: Andrei Popescu, Cambridge (GB)

(73) Assignee: Cambridge Silicon Radio Limited, Cambridge (GB)

( * ) Notice: Subject to any disclaimer, the term of this patent is extended or adjusted under 35 U.S.C. 154(b) by 0 days.

(21) Appl. No.: 13/260,439

(22) PCT Filed: Mar. 26, 2010

(86) PCT No.: PCT/EP2010/054030
§ 371 (c)(1),
(2), (4) Date: Dec. 13, 2011

(87) PCT Pub. No.: WO2010/109013
PCT Pub. Date: Sep. 30, 2010

(65) Prior Publication Data
US 2012/0121037 A1    May 17, 2012

(30) Foreign Application Priority Data

Mar. 26, 2009 (GB) .................... 0905230.9

(51) Int. Cl.
*H04B 1/10* (2006.01)
(52) U.S. Cl.
USPC .......................................... 455/223; 455/225
(58) Field of Classification Search
USPC .................... 455/218–225; 375/346
See application file for complete search history.

(56) References Cited

U.S. PATENT DOCUMENTS

| 3,949,301 A | 4/1976 | Mattei |
| 4,314,377 A | 2/1982 | Kondo et al. |
| 4,480,335 A | 10/1984 | Kishi |
| 5,036,543 A | 7/1991 | Ueno |
| 5,210,518 A * | 5/1993 | Graham et al. ............... 375/351 |
| 7,676,204 B2 * | 3/2010 | Su ................... 455/223 |
| 2004/0196928 A1 * | 10/2004 | Hessel ........................ 375/340 |

FOREIGN PATENT DOCUMENTS

EP        0317862 A1    5/1989

OTHER PUBLICATIONS

Kouwenhoven et al., "A new simple design model for FM demodulators using soft-limiters for click noise suppression," Proceedings of 1997 IEEE International Symposium on Circuits and Systems, ISCAS '97, Hong Kong Jun. 9-12, 1997, New York, NY, vol. 1, Jun. 9, 1997, pp. 265-268.

* cited by examiner

*Primary Examiner* — Christian Hannon
(74) *Attorney, Agent, or Firm* — Fulbright & Jaworski LLP

(57) ABSTRACT

Apparatus for reducing FM click noise on a demodulated FM signal, the apparatus comprising, filter means configured to produce a click detection signal according to the demodulated FM signal, click detection means configured to receive the click detection signal and produce a click occurrence signal, and click correction means configured to correct FM clicks on the demodulated FM signal according to the click occurrence signal.

10 Claims, 6 Drawing Sheets

APPARATUS AND METHOD OF REDUCING NOISE FOR FREQUENCY MODULATED SIGNALS

FIELD OF THE INVENTION

This invention relates to improvements in noise reduction in FM reception.

INTRODUCTION

A characteristic of FM reception is the so-called 'threshold effect', whereby impulsive noise appears in the FM demodulator output when the input signal to noise ratio (SNR) to the FM demodulator is low. In systems using analogue FM modulation to transmit an audio signal, the noise impulses are heard as 'clicks' in the demodulated audio signal. The process that leads to the impulsive noise has been studied extensively in [1] S. O. Rice, "Statistical properties of a sine wave plus random noise", Bell Sys. Tech. J., vol. 27, pp. 109-157, January 1948, and [2] M. J. Malone, "On the threshold effect in FM data systems", IEEE Transactions on Communication Theory, Vol. COM-14, No. 5, pp. 625-631, October 1966. The process is briefly described below.

An FM-modulated signal can be represented as:

$$c(t) = \sin(2\pi * Fc * t + \int m(t)dt),$$

where 't' represents time, Fc is the carrier frequency and m(t) is the modulating signal. The FM signal available at a receiver often contains additive noise and can be represented at baseband (for Fc=0) by the mathematical expression $$y(t) = e^{j \int m(t)dt} + n(t)$$

Note that m(t) is the instantaneous frequency deviation relative to Fc. In stereo FM broadcasts, m(t) is called 'stereo multiplex' and is a frequency multiplex of 'left+right' (L+R) and 'left−right' (L−R) audio signals, a 'pilot' tone of 19 kHz, and optionally other data or audio signals.

When the SNR of the received signal y(t) is below a certain value, the receiver component which estimates the carrier angle of the received signal loses accuracy. This results in fast steps of $2\pi$ appearing in the carrier angle estimated by the receiver. For example, in the absence of modulation (m(t)=0), a step of $2\pi$ in the estimated carrier angle occurs when noise causes the vector representing y(t) in the 'complex plane' to circle around the origin.

The rapid steps of $2\pi$ in the phase of the estimated carrier angle create impulses in the instantaneous carrier frequency estimated by the receiver. The estimated instantaneous frequency is equal to the differential of the estimated angle with respect to time and so a rapid change in phase results in a high value in the estimated output signal. These impulses are relatively short and are heard as clicks in the audio signal recovered from the stereo multiplex. With decreasing SNR, these clicks become more and more frequent per unit of time, until eventually they can no longer be heard individually, sounding like white noise to a listener.

From the equation describing y(t) above, an estimate of the modulating signal m(t) can be obtained by first estimating the angle of y(t) and then differentiating this estimated angle. This is a simple and viable method of FM demodulation. By comparison with this simple FM demodulation method, FM demodulation methods that reduce the number of noise impulses present in the demodulated signal per unit of time are known as 'threshold extension' methods.

Threshold extension by removing clicks post-demodulation has been previously researched. [3] M. J. Malone, "FM threshold extension without feedback", Proc. IEEE, pp. 200-201, February 1968, and [4] I. Bar-David, S. Shamai, "On the Rice model of noise in FM receivers", IEEE Transactions on Information Theory, vol. 34, no. 6, November 1988, show techniques for removing clicks by estimating the position of a click and applying a $2\pi$ correction to the demodulated signal at the estimated position.

What is required is an improved method of removing the clicks which takes advantage of modern signal processing technologies and accounts for the characteristics of FM stereo broadcast signals to achieve better performance.

SUMMARY OF THE INVENTION

According to a first aspect of the present invention there is provided apparatus for reducing FM click noise on a demodulated FM signal, the apparatus comprising, filter means configured to produce a click detection signal according to the demodulated FM signal, click detection means configured to receive the click detection signal and produce a click occurrence signal, and click correction means configured to correct FM clicks on the demodulated FM signal according to the click occurrence signal.

According to a second aspect of the present invention there is provided a method of reducing interference in received FM signals, the method comprising: estimating a carrier angle of a received FM signal and demodulating the signal according to the estimated carrier angle, determining that a fast step of $2\pi$ has occurred in the estimated carrier angle which results in an instance of click interference, correcting the click interference instance in the demodulated FM signal.

BRIEF DESCRIPTION OF THE DRAWINGS

The invention will be described by way of example with respect to specific embodiments thereof, and reference will be made to the drawings, in which.

DETAILED DESCRIPTION

The present invention provides an improved method for reducing the number of clicks in a demodulated signal by detecting each instance of this type of interference, and applying a correction to the output signal which removes each click.

Figure 1:
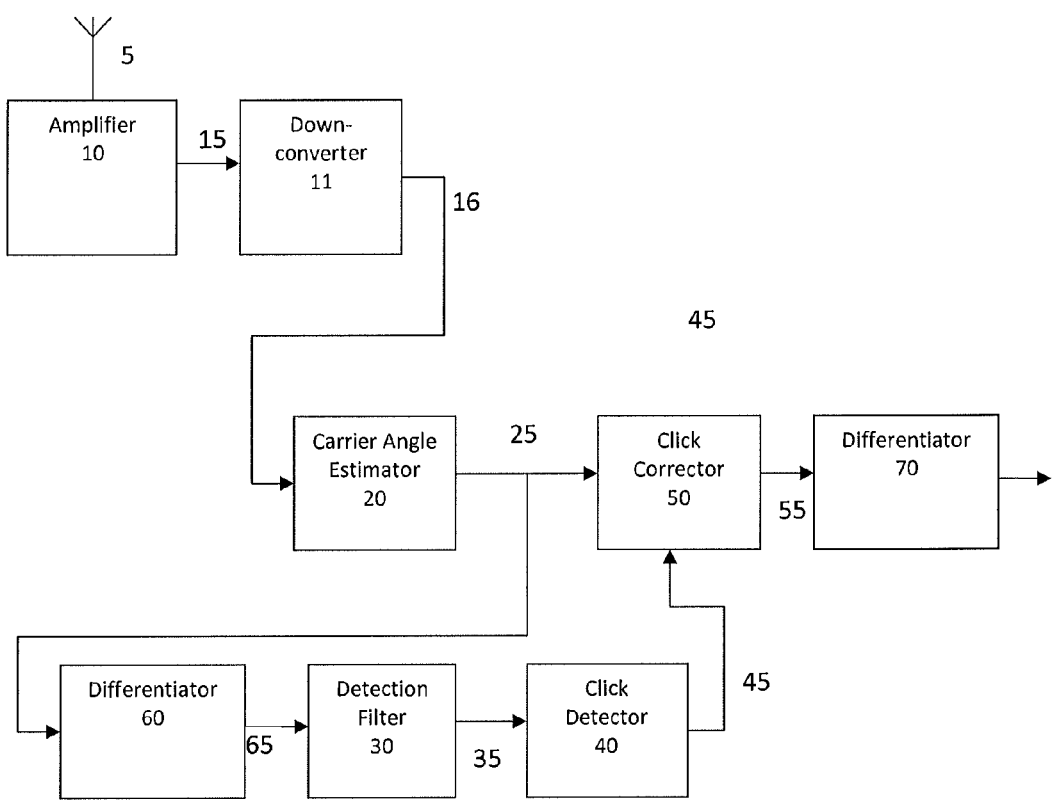
FIG. 1 illustrates a click correction system according to the present invention.

In the system illustrated in FIG. 1, the FM signal is received by antenna 5 and amplified by FM signal amplifier 10. Amplified signal 15 is then down-converted by down-converter module 11 to produce an intermediate frequency (IF) signal 16. Signal 16 is sent to carrier angle estimator 20. Carrier angle estimator 20 produces an uncorrected output signal 25 which is then split and fed into both click corrector 50 and differentiator 60. Differentiator 60 differentiates the estimated carrier angle and provides differentiated signal 65 to detection filter 30. Detection filter 30 filters out any unwanted frequencies from signal 65 to produce the click detection signal 35 which is suitable to allow click detector 40 to determine the location of clicks in the signal 25. The click location signal 45 is then applied to click corrector 50, which uses signal 45 to apply click corrections to signal 25. The output of click corrector 50 is the corrected estimated carrier angle signal 55. Signal 55 is passed to differentiator 70 whose output signal is the estimated FM modulating signal.

In an embodiment of the present invention, the procedure for removing clicks consists of the following steps:
1. Filtering the differential of the demodulated angle, to produce a 'click detection' signal.
2. Estimating where clicks occur in the demodulated angle.
3. Cancelling each click by adding a correction at the estimated location of the click.

Each of these steps will now be described in detail.

Filtering

In an embodiment of the invention, a filter 30 is used to filter the differential of the demodulated angle to produce a click detection signal 35 which allows easier identification of click positions. Unlike the filters described in the prior art, the filter of this embodiment is specially designed for reception of FM stereo broadcast signals.

To produce a 'click detection' signal, the filter is designed according to the following criteria
a. The filter should reject the wanted signal and preserve or amplify the clicks. Ideally, the click detection signal should be clear of most of the received signal except for the clicks caused by the noise present in the IF signal.
b. The filter should not cause excessive dispersion of the clicks. i.e. when a click is applied to the input of the detection filter, the filter should not be such that the resulting output signal has components of large amplitude (relative to its largest amplitude) occurring over a long period of time. A reduced dispersion of the filtered clicks allows a good estimation of the click positions and reduces the likelihood that the estimated position of the click is far from its true position. This also means that the amplitude of the filter output signal peak (for a click input) is larger for equal energy, resulting in a more reliable detection of clicks on the basis of the filter output signal amplitude
c. The filter should attenuate high frequencies, to reduce 'non-click' noise. High frequencies which do not form the clicks are effectively excluded from the click detection signal this way.

Figure 2:
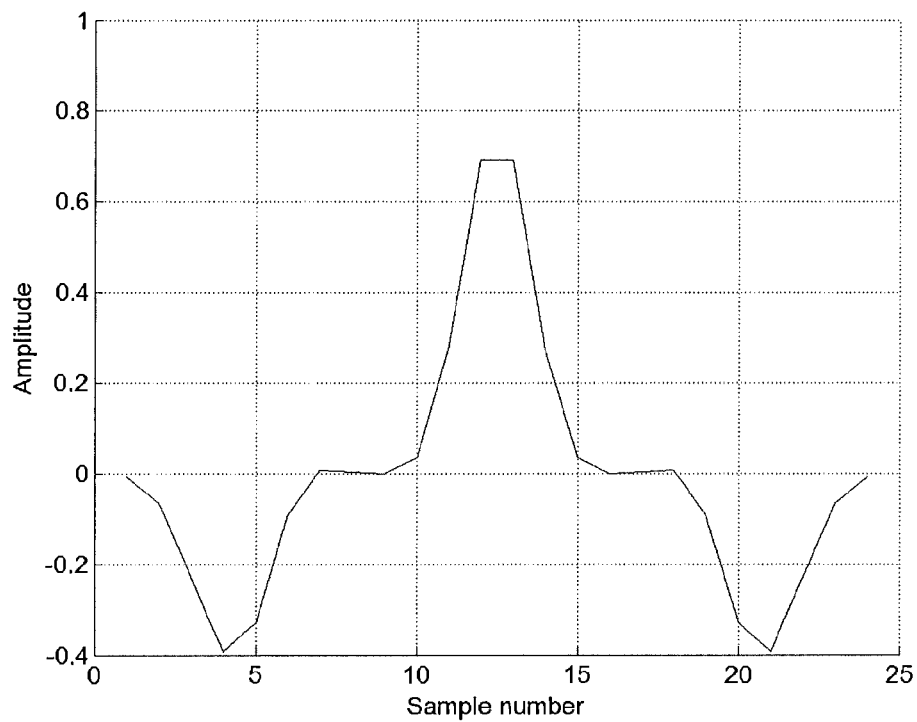
FIG. 2 illustrates a detection filter impulse response according to a typical embodiment of the present invention.
Figure 3:
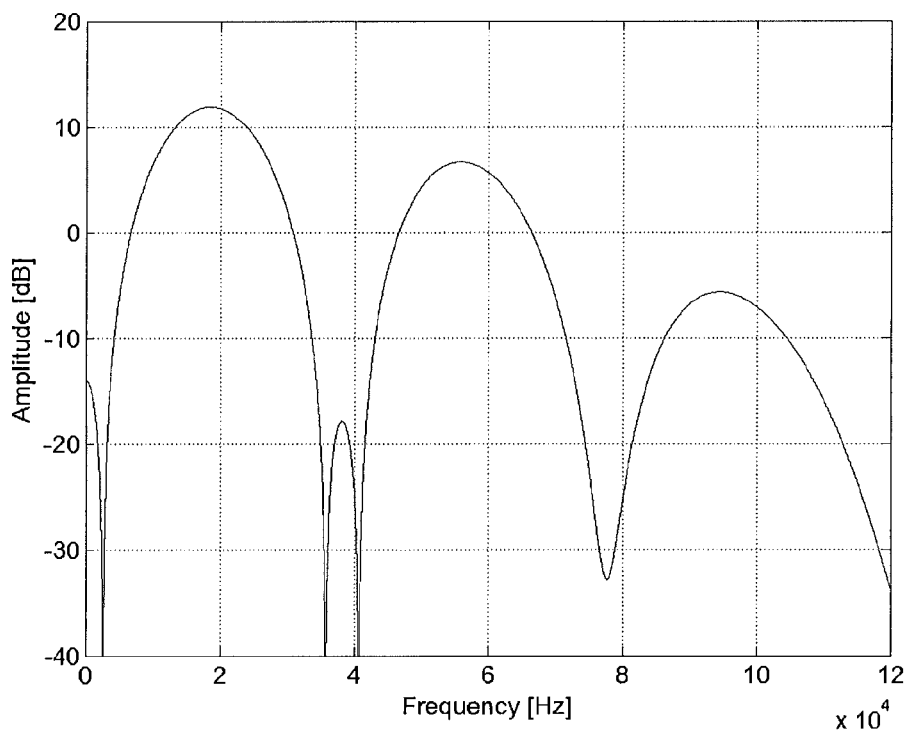
FIG. 3 illustrates the frequency response of a detection filter according to a typical embodiment of the present invention.

A typical detection filter impulse response according to one embodiment of the invention is illustrated in FIG. 2. FIG. 3 illustrates its frequency response. The detection filter is designed to have a high attenuation around the 'mono' and 'stereo' sub-carrier frequencies, respectively 0 and 38 kHz in a typical FM broadcast receiver. The filter is designed to preserve other frequencies, in particular relatively low frequencies located between the mono and stereo sub-carriers.

In one embodiment of the present invention, the pilot tone is removed from the click detection signal prior to the step of estimating click positions. The phase and amplitude of the pilot tone are stable and so they are easy to estimate in order to remove the pilot tone from the click detection signal by subtraction. If it is not rejected in this way, the pilot tone interferes with the threshold-based detection of the clicks. For example, if the pilot tone happens to add destructively to a detection filter output corresponding to a click, in conjunction with noise it can reduce the detection filter output below the threshold and so it can cause the detection of that click to fail. Therefore, rejecting the 19 kHz pilot tone from the click detection signal improves the reliability of click detection.

Estimation/Detection

In one embodiment of the invention, a click is detected by click detector 40 when the click detection signal 35 meets either of the following conditions at that time:
1. Its absolute value exceeds a first threshold and is largest within a first time neighbourhood surrounding it; or
2. Its absolute value exceeds a second, higher threshold, and is largest within a second, smaller time neighbourhood surrounding it.

The first type of test is suitable for the detection of isolated clicks, whereas the second type of test resolves some occurrences of multiple adjacent clicks. Therefore, the advantage provided by using the two types of threshold tests is that both isolated clicks and clusters of clicks can be effectively detected from the filtered signal.

The click cancellation performs well when the audio component within the FM modulating signal is of a frequency below 5 kHz, regardless of the signal frequency deviation, for R=L, R=0 and R=−L signals. Audio modulation that is high frequency (above 7 kHz) and also has large frequency deviation may not be sufficiently rejected by the detection filter to allow reliable click detection, resulting in 'false' detection of clicks.

Click detection may be unreliable in the presence of high-frequency wanted modulation with large frequency deviation. Therefore, in a preferred embodiment, to prevent degradation of the demodulated signal caused by false click detection, the click detection is disabled when the click detection signal medium-term average power exceeds a threshold. However, on average the signal power in real FM broadcasts is concentrated in low frequencies, and therefore most of the time the click detection is not disabled in this way.

Cancelling

Cancellation of the clicks is performed by click corrector 50 on demodulated signal 25 according to the click location signal 45. In one embodiment, the click cancellation is performed by adding a correction of magnitude $2\pi$ and opposite polarity to the detected click.

An advantage of cancelling the clicks from the demodulated FM signal in this way, compared with alternative methods of threshold extension such as a phase locked loop FM demodulator (PLL FM demodulator) or an FM feedback (FMFB) demodulator, is that high frequency information in the modulating signal, such as the stereo sub-carrier and RDS sub-carrier, is preserved. In comparison, the bandwidth of PLL or FMFB demodulators has to be reduced to improve their sensitivity, for example to select only the 'mono' or 'left+right' audio component of the stereo multiplex signal, which occupies frequencies below 15 kHz.

Figure 4:
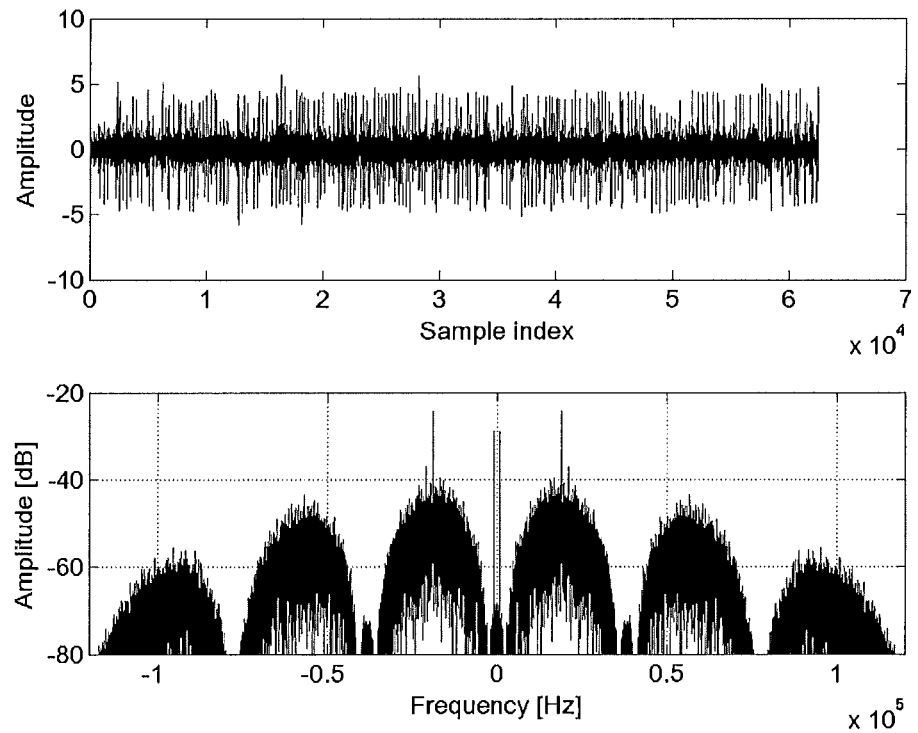
FIG. 4 illustrates the click detection signal before cancellation and its frequency spectrum, when the FM modulation consists of a stereo multiplex signal including a mono (L=R) 1 kHz audio tone with 75 kHz frequency deviation and a pilot tone with 6.75 kHz frequency deviation.
Figure 5:
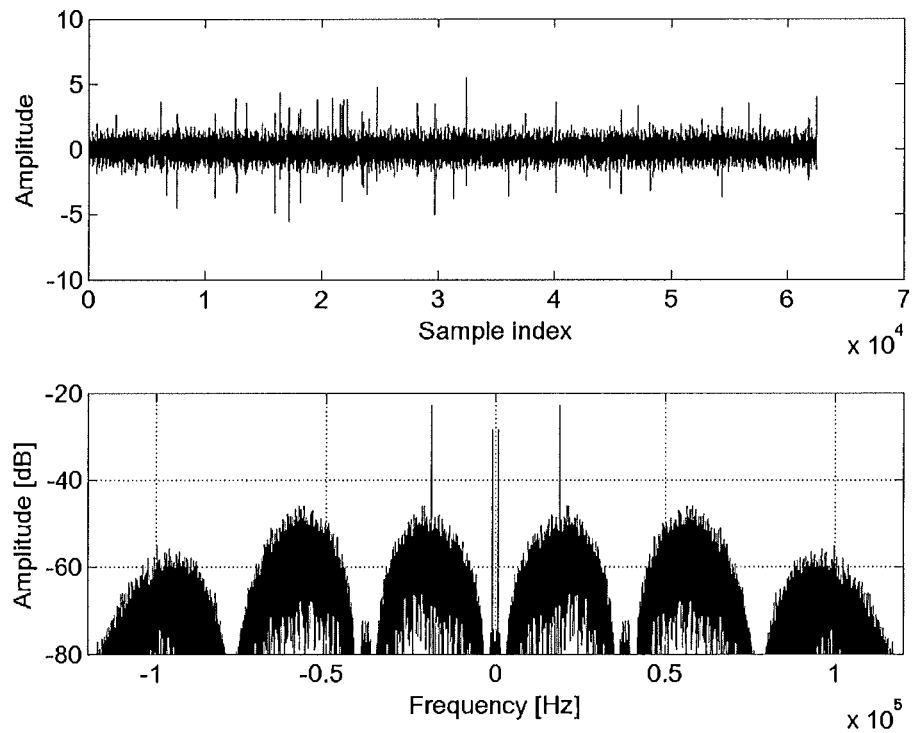
FIG. 5 illustrates the click detection signal after one pass of the click cancellation algorithm and its frequency spectrum, for the same FM modulating signal as the one corresponding to FIG. 4.

FIG. 4 illustrates the click detection signal and its frequency spectrum before click cancellation and FIG. 5 illustrates the click detection signal and its frequency spectrum after one iteration of the click cancellation algorithm, when the FM modulation consists of a stereo multiplex signal including a mono (L=R) 1 kHz audio tone with 75 kHz frequency deviation and a pilot tone with 615 kHz frequency deviation. Clicks are visible as large amplitude impulses present in the click detection signal. FIGS. 4 and 5 demonstrate (a) the effectiveness of the cancellation (there are much fewer clicks left after one iteration of the click cancellation algorithm); (b) removing the clicks reduces the noise especially in low frequencies, suggesting that that is where a lot of the power of clicks is located.

Iterative Application

In one embodiment of the invention, iterative application of the click removal process provides improved click removal success and as a result it improves the quality of the demodulated signal.

Figure 6:
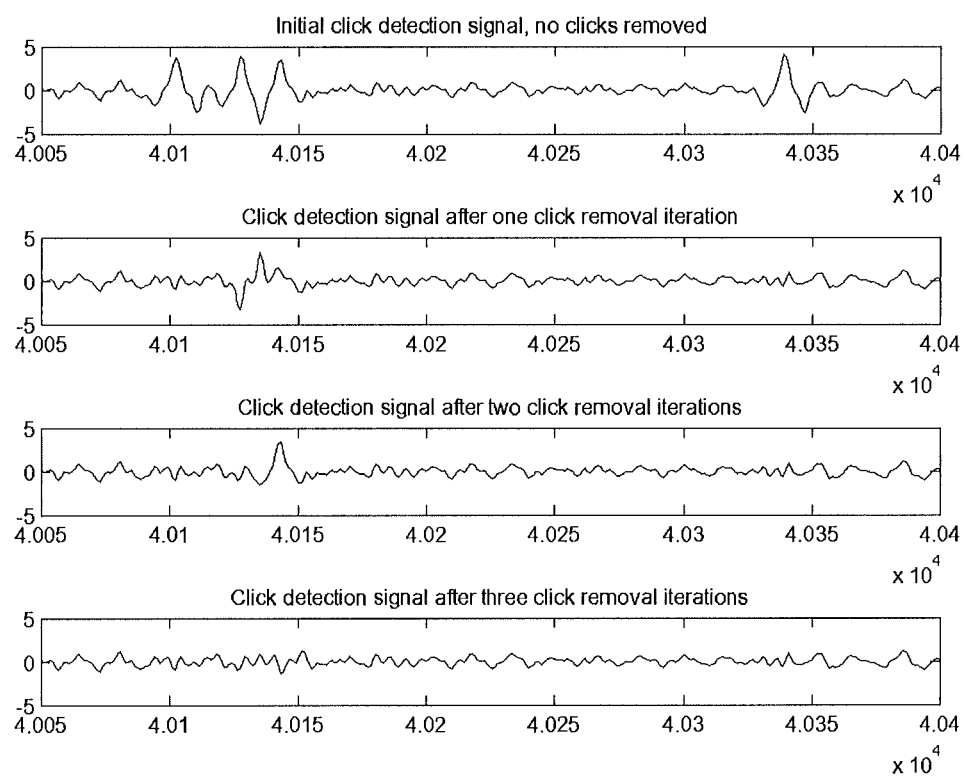
FIG. 6 illustrates a short section in time of the click detection signal prior to click cancellation and after one, two or three passes (iterations) of the click cancellation algorithm.

FIG. 6 illustrates a short section in time of the click detection signal prior to click cancellation and after one, two or three passes (iterations) of the click cancellation algorithm. FIG. 6 shows that (a) isolated clicks can be resolved in one pass of the click cancellation algorithm, while (b) iterative application of the click cancellation algorithm can resolve multiple clicks that are very close together in time.

Figure 7:
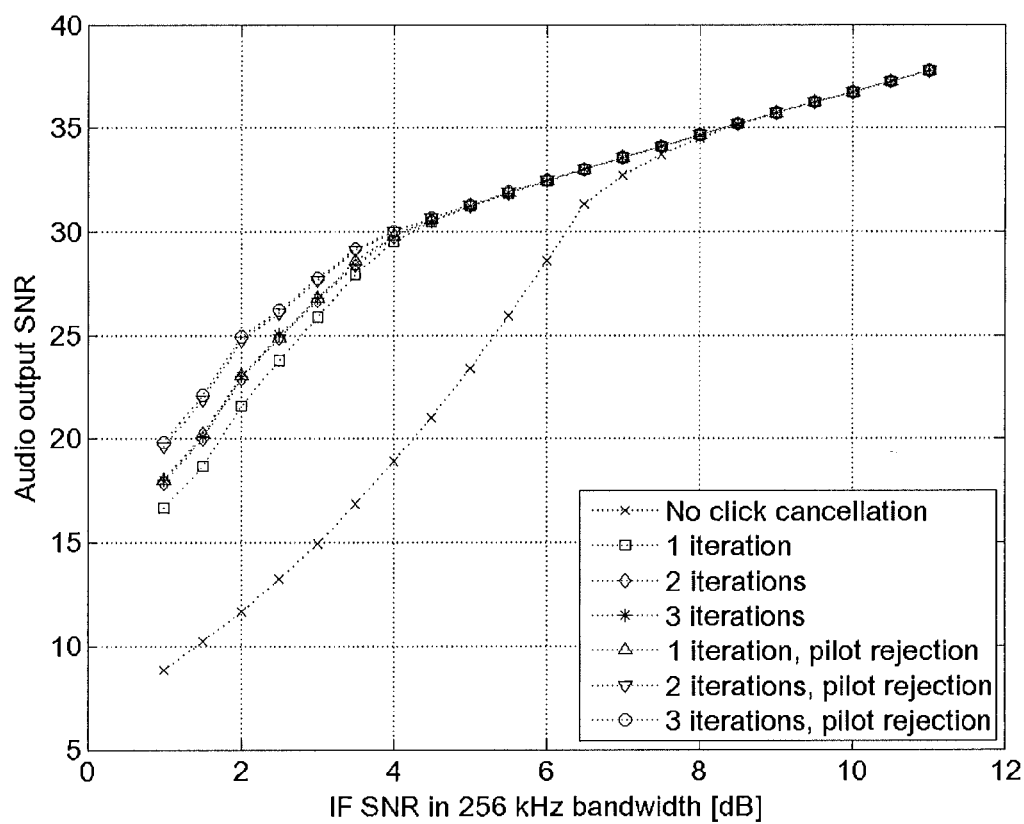
FIG. 7 illustrates audio output signal to noise ratio (SNR) vs. Intermediate Frequency SNR, when varying the number of applications of the click cancellation algorithm, and when the click cancellation algorithm includes rejecting the pilot tone or not.

FIG. 7 presents the results of Monte-Carlo simulation of the audio output signal to noise ratio (SNR) vs. Intermediate Frequency SNR (IF SNR}, when varying the number of applications of the click cancellation algorithm, and with or without rejecting the 19 kHz pilot tone prior to click cancellation. The simulation assumes a mono (L=R) 1 kHz audio tone modulation with 22.5 kHz audio frequency deviation and including a pilot tone with a 6.75 kHz frequency deviation. The click cancellation improves sensitivity (for 26 dB output SNR) by more than 3 dB. Using two iterations provides a gain of about 0.5 dB compared to using a single iteration. Rejecting the 19 kHz pilot tone from the click detection signal prior to click cancellation provides a further SNR gain of around 0.3 dB.

Figure 8:
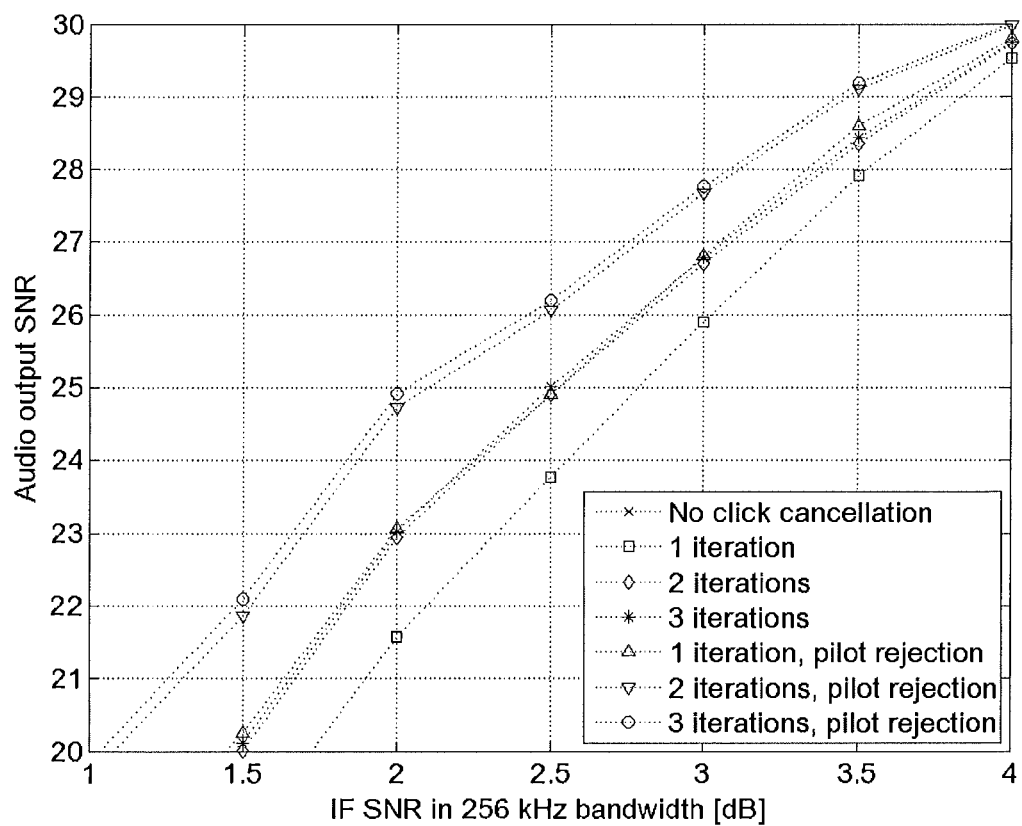
FIG. 8 illustrates an enlarged view of the graph shown in FIG. 7.

FIG. 8 is a 'zoomed-in' version of FIG. 7, showing that to achieve 26 dB audio output SNR, with 2 click cancellation iterations and pilot tone rejection, the receiver requires a 2.5 dB IF SNR in 256 kHz bandwidth. For example, this means that with a receiver noise figure of 2 dB, the receiver sensitivity is equal to −119.75+2+2.5=−115.25 dBm (the power of thermal noise fed into a matched receiver at room temperature is −119.75 dBm).

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

The invention claimed is:

1. An apparatus for reducing FM click noise on a demodulated FM signal, the apparatus comprising:
filter means configured to produce a click detection signal according to the demodulated FM signal,
click detection means configured to receive the click detection signal and produce a click occurrence signal, and
click correction means configured to correct FM clicks on the demodulated FM signal according to the click occurrence signal,
wherein the filter means is configured to produce a click detection signal having the characteristics of:
being a filtered differential of the demodulated carrier angle,
the signal information of the demodulated FM signal being substantially removed and FM click noise occurring on the demodulated FM signal not being removed,
a low output dispersion of the FM clicks, and
attenuation of high frequencies such that non-click noise is reduced.

2. Apparatus according to claim 1, wherein the click detection signal produced by the filter means has the further characteristic of:
high attenuation around the mono and stereo FM sub-carrier frequencies.

3. Apparatus according to claim 2, wherein the mono and stereo FM sub-carrier frequencies are 0 kHz and 38 kHz respectively.

4. Apparatus according to claim 1, wherein the click detection signal has the further characteristics of the FM pilot tone being removed.

5. An apparatus for reducing FM click noise on a demodulated FM signal, the apparatus comprising:
filter means configured to produce a click detection signal according to the demodulated FM signal,
click detection means configured to receive the click detection signal and produce a click occurrence signal, and
click correction means configured to correct FM clicks on the demodulated FM signal according to the click occurrence signal,
wherein the click detection means performs the steps of:
receiving an input signal,
determining when the input signal has the criteria of an absolute value exceeding a first threshold and being largest within a first temporal neighborhood surrounding it, or
an absolute value exceeding a second threshold and being largest within a second temporal neighborhood surrounding it, wherein the second threshold is higher than the first threshold and the second neighborhood is smaller than the first neighborhood,
generating an output signal according to when it is determined that at least one of the criteria is met.

6. Apparatus according to claim 5, wherein the click detection means performs the determining and generation step iteratively on received input signal for at least two passes.

7. An apparatus for reducing FM click noise on a demodulated FM signal, the apparatus comprising:
filter means configured to produce a click detection signal according to the demodulated FM signal, wherein the filter means is configured to produce a click detection signal having the characteristics of:
being a filtered differential of the demodulated carrier angle,
the signal information of the demodulated FM signal being substantially removed and FM click noise occurring on the demodulated FM signal not being removed,
a low output dispersion of the FM clicks, and
attenuation of high frequencies such that non-click noise is reduced,
click detection means configured to receive the click detection signal and produce a click occurrence signal, and
click correction means configured to correct FM clicks on the demodulated FM signal according to the click occurrence signal, wherein the click correction means is configured to correct FM clicks on the received FM signal by adding a correction of magnitude $2\pi$ and opposite polarity to the demodulated FM signal according to the click occurrence signal.

8. Apparatus according to claim 7, wherein click correction is disabled when the average power of the click detection signal exceeds a threshold.

9. A method of reducing interference in received FM signals, the method comprising:

estimating a carrier angle of a received FM signal and demodulating the signal according to the estimated carrier angle, determining that a fast step of $2\pi$ has occurred in the estimated carrier angle which results in an instance of click interference, filtering the demodulated signal to produce a click detection signal having the characteristics of:

being a filtered differential of the demodulated carrier angle, the signal information of the demodulated FM signal being substantially removed and FM click noise occurring on the demodulated FM signal not being removed, a low output dispersion of the FM clicks, and attenuation of high frequencies such that non-click noise is reduced, and correcting the click interference instance in the demodulated FM signal.

10. The method according to claim 9, wherein the determining step comprises the sub-steps of:

generating a click occurrence signal by detecting click occurrence in the click detection signal, and wherein the correcting step comprises applying a correction of magnitude $2\pi$ and opposite polarity to the demodulated FM signal according to the click occurrence signal.

* * * * *

UNITED STATES PATENT AND TRADEMARK OFFICE
CERTIFICATE OF CORRECTION

PATENT NO. : 8,725,100 B2
APPLICATION NO. : 13/260439
DATED : May 13, 2014
INVENTOR(S) : Andrei Barbu Popescu Page 1 of 1

It is certified that error appears in the above-identified patent and that said Letters Patent is hereby corrected as shown below:

In the Specification:

At column 5, line number 2, delete "615 kHz" and replace with --6.75 kHz--.

Signed and Sealed this
Seventh Day of October, 2014

Michelle K. Lee
*Deputy Director of the United States Patent and Trademark Office*